(12) United States Patent
Mayfield et al.

(10) Patent No.: US 8,854,069 B2
(45) Date of Patent: Oct. 7, 2014

(54) PRODUCTION INTEGRATED CIRCUIT TEST HANDLER USING MICROCONTROLLER READING A THERMAL DIODE OF A DEVICE UNDER TEST FOR TEMPERATURE CONTROL

(75) Inventors: Joseph Shelton Mayfield, Cypress, TX (US); Nolan Riley, Rosharon, TX (US); Chad Turner, Sugar Land, TX (US); Angelo Sanchez, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 400 days.

(21) Appl. No.: 13/343,866

(22) Filed: Jan. 5, 2012

(65) Prior Publication Data

US 2012/0169363 A1 Jul. 5, 2012

Related U.S. Application Data

(60) Provisional application No. 61/434,948, filed on Jan. 21, 2011, provisional application No. 61/429,848, filed on Jan. 5, 2011.

(51) Int. Cl.
*G01R 31/10* (2006.01)
*G01R 31/28* (2006.01)

(52) U.S. Cl.
CPC .................... *G01R 31/2867* (2013.01); *G01R 31/2877* (2013.01)
USPC ............. 324/750.08; 324/750.11; 324/750.14

(58) Field of Classification Search
None
See application file for complete search history.

(56) References Cited

U.S. PATENT DOCUMENTS

2009/0051381 A1* 2/2009 Hosoda et al. ................ 324/760
2012/0119767 A1* 5/2012 Su ............................ 324/750.03

\* cited by examiner

*Primary Examiner* — Minh N Tang
(74) *Attorney, Agent, or Firm* — Robert D. Marshall, Jr.; Frederick J. Telecky, Jr.

(57) ABSTRACT

Production test of integrated circuit face thermal management challenges with higher power devices. Current production handlers do not have adequate thermal management characteristics. This invention employs thermal diodes on each device under test and a closed loop microprocessor controlled feedback system for thermal control during production test. The feedback system controls the open/close state of a valve supplying cooling fluid to bathe the integrated circuit based upon the difference between a temperature indicated by at least one thermal diode and a set point temperature.

12 Claims, 9 Drawing Sheets

PRODUCTION INTEGRATED CIRCUIT TEST HANDLER USING MICROCONTROLLER READING A THERMAL DIODE OF A DEVICE UNDER TEST FOR TEMPERATURE CONTROL

CLAIM OF PRIORITY

This application claims priority under 35 U.S.C. 119(e) (1) to U.S. Provisional Application No. 61/429,848 filed Jan. 5, 2011 and U.S. Provisional Application No. 61/434,948 filed Jan. 21, 2011.

TECHNICAL FIELD OF THE INVENTION

The technical field of this invention is integrated circuit testing.

BACKGROUND OF THE INVENTION

This invention controls the temperature of a self-heating, high power device during production test.

SUMMARY OF THE INVENTION

This invention places a microcontroller on the device under test (DUT) load board or on an external enclosure couple to the DUT load board. This microcontroller reads the DUT's thermal diode. The microcontroller controls a metering valve connected to an existing cooling fluid line (such as liquid nitrogen ($LN_2$) or compressed air) based on the reading. Based on the DUT's internal die temperature, the microcontroller will open or close the metering valve to regulate the device temperature. The cooling fluid will be injected to the top of the device with a special pocketed nest and manifold system designed to create cooling fluid flow over much of the DUT top's surface area. This invention can be extended for use system with multiple die in one package (SIP), where each die under test can be individually read and thermally controlled independent of the other die in the package.

BRIEF DESCRIPTION OF THE DRAWINGS

These and other aspects of this invention are illustrated in the drawings, in which.

DETAILED DESCRIPTION OF PREFERRED EMBODIMENTS

This invention is easy to implement and is a cost effective way to retrofit existing production handler to be able to test higher power devices having high self heating.

This invention is more cost effective than prior handlers that are single site and very expensive. This invention can retrofit to existing multisite handlers.

Existing handlers use airflow only thermal management and are not capable of maintaining a temperature guard band for products with this power dissipation. This current roadmap of products do not reach power dissipation ranges that warrant a more expensive handler solution used for 80+ watt range devices. These products to which this invention is applicable are in the mid power range. In this range standard airflow-only handlers are not adequate and the more costly handler lines (such as an external chiller, liquid cooled chuck) seem like overkill.

Thus it would be advantageous to develop an economical retrofit to existing of handlers that would allow for accurate temperature control. The DUTs suitable for this invention have multiple on-die thermal diodes. These permit development of an effective solution. This invention is called Cryogenic Temperature Control System (CTCS). This invention uses the DUT thermal diodes for real time on-die temperature measurement. The system uses an $I^2C$ communications chip (on-board the tester adapter board) to read the DUT thermal diode(s). An 8-bit microcontroller running code to measure the temperature uses this information to calculate a third order control system response. This microcontroller sends a duty-cycled pulse to $LN_2$ solenoid drive circuitry. The $LN_2$ is directed through a cryogenic hose into a manifold on the back of the DUT handler. The manifold has an interface system to deliver $LN_2$ bursts into the DUT nest for circulation around the DUT lid and then recapture for expulsion to the ambient air outside the handler. This invention allows accurate temperature control on a per-die basis of SIP (stacked die) products that we may encounter.

Figure 1:
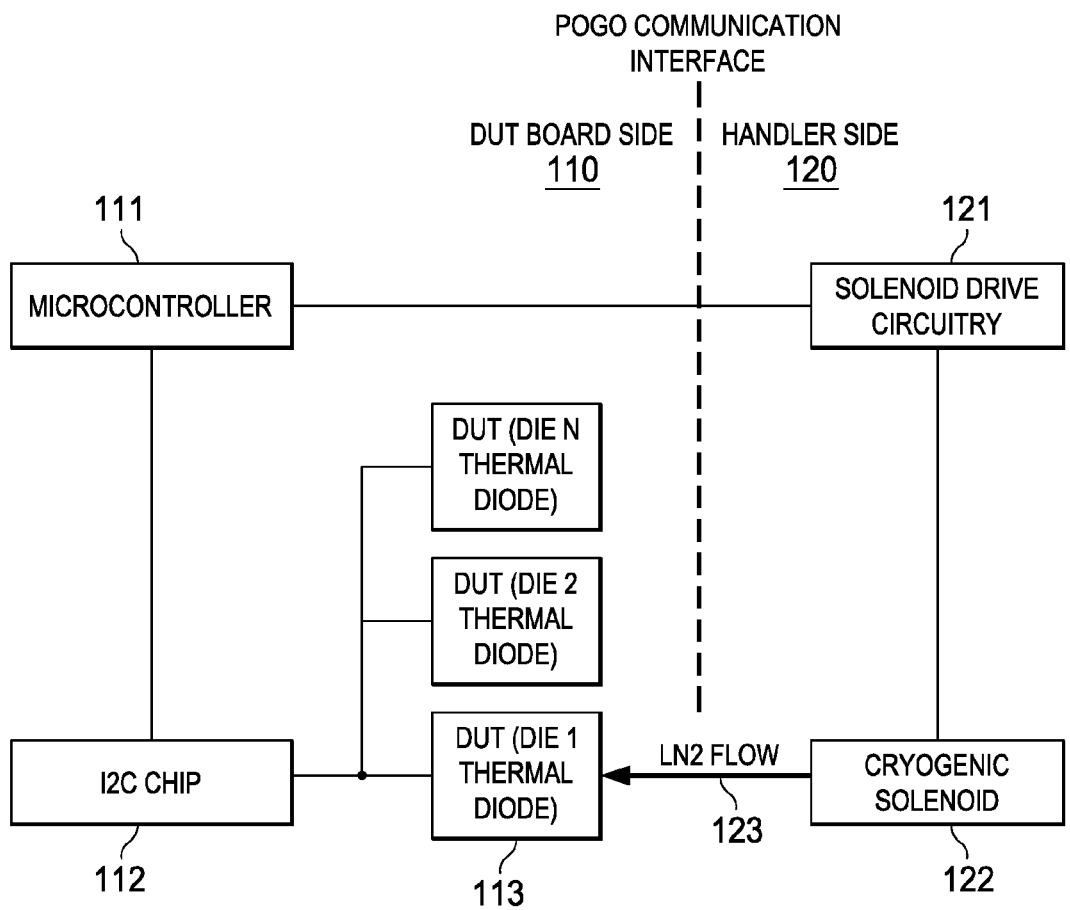
FIG. 1 is a schematic illustration of the electronics of this invention.

FIG. 1 is a schematic illustration of the electronics of this invention. This invention includes parts on the DUT board side 110 and on the handler side 120. DUT board side 110 includes microcontroller 111, $I^2C$ chip 112 and plural DUT wafers 113. Handler side 120 includes solenoid drive circuitry 121, cryogenic solenoid 122 and $LN_2$ flow 123. Thermo diodes on wafers 113 supply signals corresponding to their current temperatures. $I^2C$ chip 112 conditions these signals for use by microcontroller 111. In this embodiment $I^2C$ chip 112 is an LM9534 which is more fully explained below. Microcontroller 111 produces a solenoid drive signal for temperature control. A pago communications interface transfers signals from microcontroller 111 to solenoid drive circuitry 121. Solenoid drive circuitry 121 controls the opening and closing of solenoid 122. This controls a value controlling $LN_2$ flow 123. $LN_2$ flow 123 influences the temperature measured by the thermo diodes of wafers 113. Microcontroller 111 operates upon the measured temperature to control solenoid 122 for thermal control during production electrical test of the DUT.

Prior art uses the following method to monitor DUT temperature during test was by reading a thermal diode during the test flow. This function uses the ideality factor algorithm (equation (1) below) to calculate temperature by forcing two different currents through the thermal diode and reading the voltage results from each forced current. The force currents typically differ by a factor of 10:1. The measured temperature $T_C$ is given by:

$$T_C = \frac{(V_H - V_L)}{1.985 \times 10^{-4} \times n} - 273.15 \quad (1)$$

where: $V_H$ is the voltage reading during the higher force current; $V_L$ is the voltage reading during the lower force current; and n is an ideality factor of the thermal diode.

There is a problem with this prior art method. With this prior art method temperature readings cannot be made in real time. In addition each reading causes an increase in test time. The prior art typically executes the thermal diode read function either before a test function or after the test function. As a result the prior art measurement is not an accurate temperature reading during pattern execution. Thus there is a need for an external method of reading of the thermal diode that does not use the test program.

This invention is a solution to this problem. In this invention circuits are installed on the tester adapter boards to provide the CTCS with real-time DUT temperature readings. This invention preferably uses a National Semiconductor LM95234 device to read the on-chip thermal diodes. The LM95234 preferably is given direct access to the DUT thermal diode pins and is connected to our microcontroller via a molex connector. For multi-site tester adapter boards this circuit is repeated for each site. The tester adapter boards preferably also has a Texas Instruments TMP100 (temperature monitor) mounted on the DUT side 110. This temperature monitor is accessed by microcontroller 111, allowing measurement of the handler ambient temperature.

Microcontroller 111 controls the DUT temperature. Microcontroller 111 monitors the device temperature in real-time and controls a cooling device. This invention preferably includes an Arduino ATMEGA328 microcontroller because of its small size, low cost and ease of code development. The Arduino microcontroller includes the ability to communicate to other devices using an I²C link. In the preferred embodiment of this invention the tester adapter board uses a remote diode temperature sensor IC that communicates the temperature readings of multiple thermal diodes through an I²C channel. With this connected to our microcontroller, we have the ability to read the device temperature of multiple sites as well as the top and bottom side temperature of the tester adapter board. These temperature readings preferably are collected real-time and stored in a vector format for further analysis. The microcontroller controls the self heating of DUT by pulsing cryogenic solenoid 122 injecting boiled $LN_2$ gas directly on the device lid. Early experiments showed the need to develop a smart algorithm to calculate the $LN_2$ solenoid pulse duration in order to keep DUT die temperatures within the specified guard band.

Figure 2:
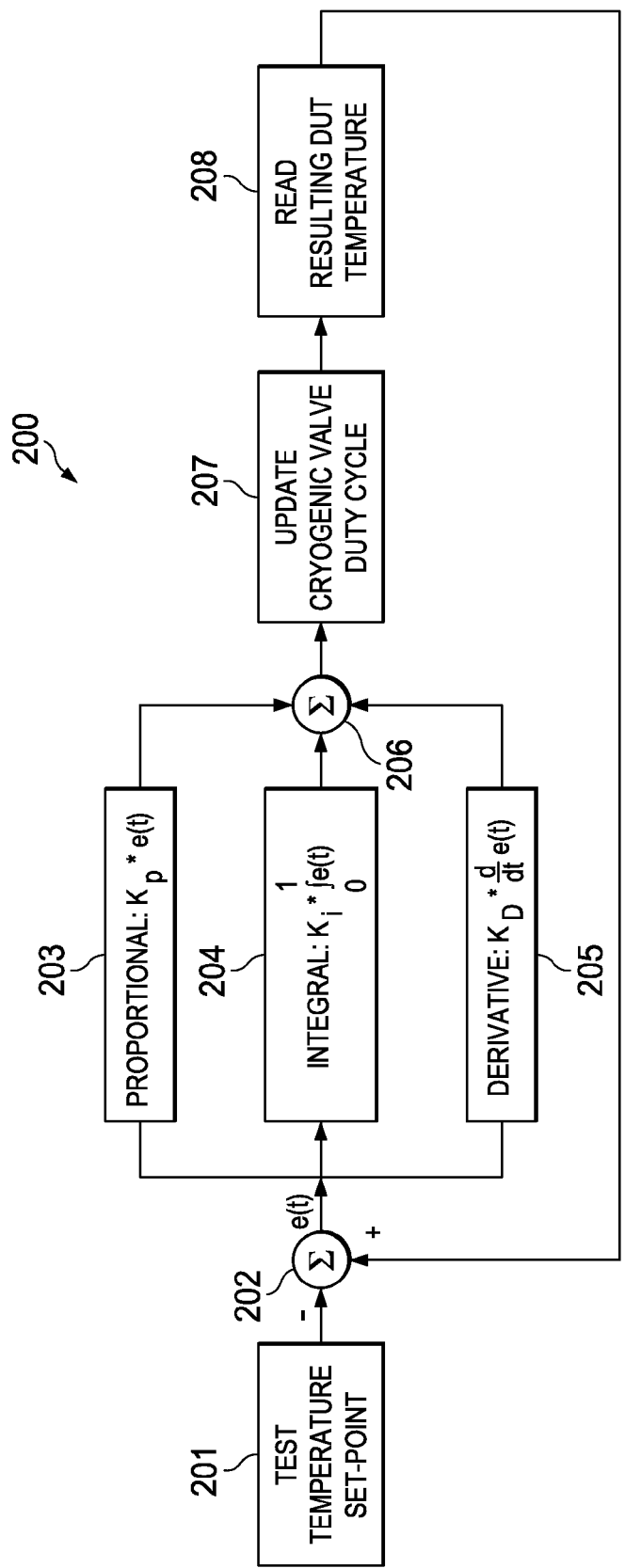
FIG. 2 illustrates the Proportional-Integral-Derivative (PID) feedback control system of the microcontroller in schematic form.

FIG. 2 illustrates CICS system software-based Proportional-Integral-Derivative (PID) feedback control system 200 in schematic form. Control system 200 receives an independent input 201 determining the desired temperature. Summer 202 subtracts an actual measured temperature from sensor 208 from the set point temperature generating an error signal e(t). According to the preferred embodiment of this invention the cryogenic valve is operated on a one-second period Pulse Width Modulation (PWM) scheme. Microcontroller 111 sets the duty cycle of the PWM by PID control. In order to achieve optimal temperature control, special consideration had to be given to this software implementation.

Block 203 computes the proportional aspect of the PID from a product of error signal e(t) and a proportional constant $K_P$ ($K_P*e(t)$). This component increases the PWM duty cycle proportional to the error signal.

Block 204 computes the Integral factor. This is the product of an integral constant $K_I$ by an integral of the error e(t)

$$\left(K_I * \int_0^t e(t)\right).$$

In a discrete sampled system this integral is computed by multiplying the time elapsed since the last calculation by the error signal e(t). This portion of the PID control helps to eliminate any steady-state error in the DUT test temperature by summing the instantaneous error over time.

Block 205 computes the Derivative term. This is the product of a derivative constant $K_D$ and the derivative of the error signal $$\left(K_D * \frac{d}{dt}e(t)\right).$$

In a discrete sampled system this derivative is computed by subtracting the error from the previous calculation by the present error and dividing this difference by the time elapsed between the two readings. This portion of the control system helps to control over-shoot and maintain system stability.

Each of the three individual PID terms has an associated constant that is used to fine-tune the response of the system ($K_P$, $K_I$, $K_D$). The CTCS uses these constants to guard against system over-shoot which might result in under-testing the DUT. Summer 206 sums these three terms of the PID control calculation generating am overall PID result. Block 207 translates this PID result to a PWM duty cycle by dividing by a maxoutput constant. This constant gives yet another tool that can be used to adjust system response. This signal controls the cryogenic solenoid. The cryogenic solenoid controls the rate of supply of $LN_2$ to the DUT. This in turn controls the DUT temperature. Sensor 208 measures the DUT temperature and completes the feedback loop.

The preferred cryogenic solenoid is a 24 Volt cryogenic solenoid specially manufactured for $LN_2$ service applications by GEMS Sensors and Controls. The specified drive current necessary to close this solenoid is 3 Amperes. Since the microcontroller drive current is only specified in the mA range, This invention includes a circuit to drive the solenoid, using a Texas Instruments OPA548 operational amplifier.

Figure 3:
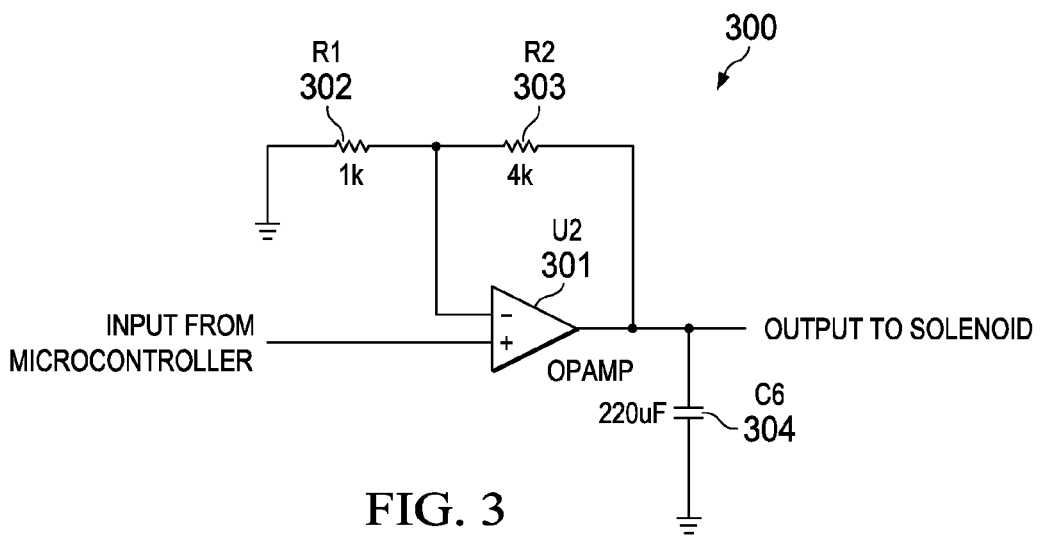
FIG. 3 is a simplified schematic diagram of the solenoid drive circuit.

FIG. 3 is a simplified schematic diagram of this solenoid drive circuit 300. Operational amplifier 301 receives an input from the microcontroller on its inverting input. The non-inverting input of operational amplifier 301 is connected to the center node of a voltage divider formed of resistors 302 and 303. In the preferred embodiment illustrated in FIG. 3, resistor 302 is 1 KΩ and resistor 303 4 KΩ. The voltage divider is connected between the output of operational amplifier 301 and ground. The output of operational amplifier 301 also connects to one terminal of capacitor 304, whose other terminal is connected to ground. As illustrated in FIG. 3 capacitor 304 is preferably 220 µf.

This circuit is powered using an external power supply. The exemplary values of resistors 302 and 303 provide 5:1 non-inverting gain. This gain was selected to match the 22 V input requirement of the selected solenoid.

Figure 4:
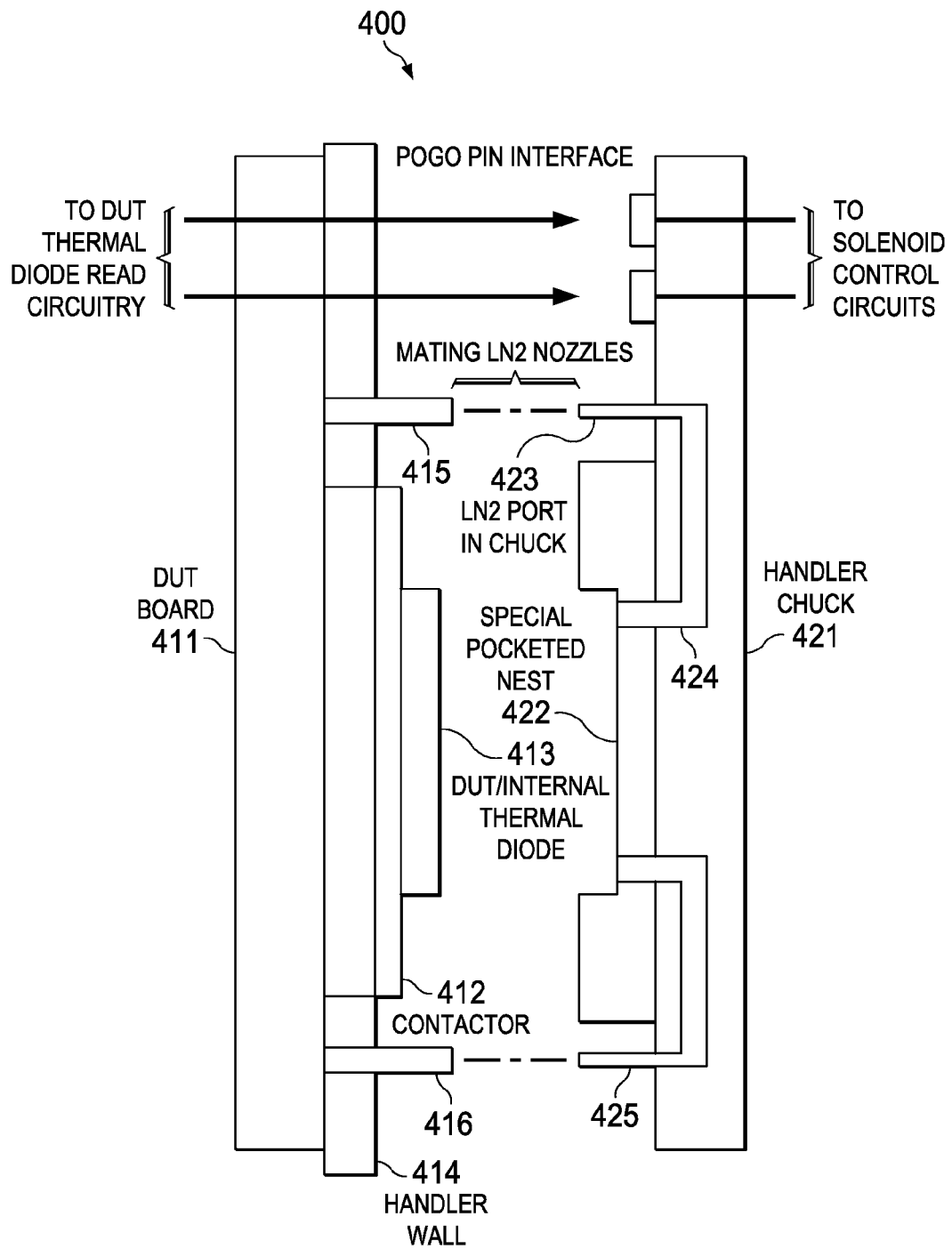
FIG. 4 is a simplified cross-sectional view of the handler interface of this invention.

FIG. 4 is a simplified cross-sectional view of the handler interface 400 of this invention. Handler interface 400 includes a DUT side and a solenoid side. DUT side includes DUT board 411, contactor 412, a holding space for the DUT with the internal thermal diode 413, and a handler wall 414 (shown in shadow) that surrounds the DUT. The solenoid side includes handler chuck 421, a special pocketed nest 422 and a LN$_2$ port 423 in chuck 421. Electrical lines from the DUT side connect to lines of the solenoid control circuit via a pogo pin interface.

Handler interface 400 uses an National Pipe Fitting (NPT) connection to perform delivery to the lid of the DUT and expel the boiled N2 gas outside of the handler. Handler interface 400 implements a stationary manifold in the adapter plate in order to limit the number of moving parts. LN$_2$ is piped from inlet pipe 415 via the NPT fitting through that plate to inlet 424 including specially designed nozzles that protrude into the handler chamber. The chuck/nest assembly have mating nozzles in a larger ID that meet the manifold nozzles and make a connection as the chuck and nest assembly plunge towards the tester adapter board. The chuck nozzles then route the LN$_2$ through ports to the nest, where the LN$_2$ is circulated over the DUT lid. The LN$_2$ is captured by a second port 425 and coupled to outlet 416 by a second NPT fitting. The captured LN$_2$ is expelled through another set of plumbing to the outside air.

Figure 5:
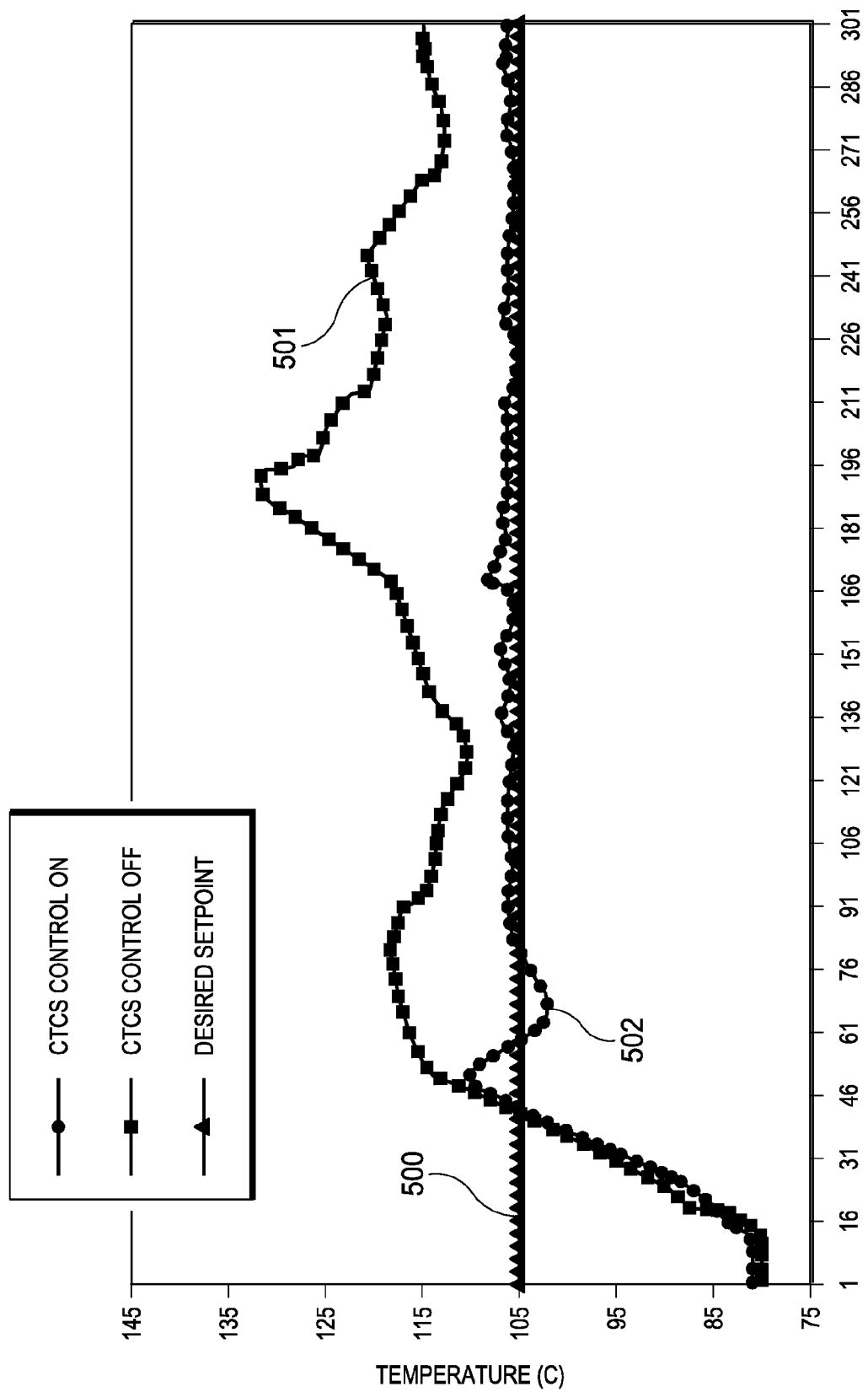
FIGS. 5, 6 and 7 compare the thermal performance of this invention with the control program turned ON and OFF for several set point temperatures.
Figure 6:
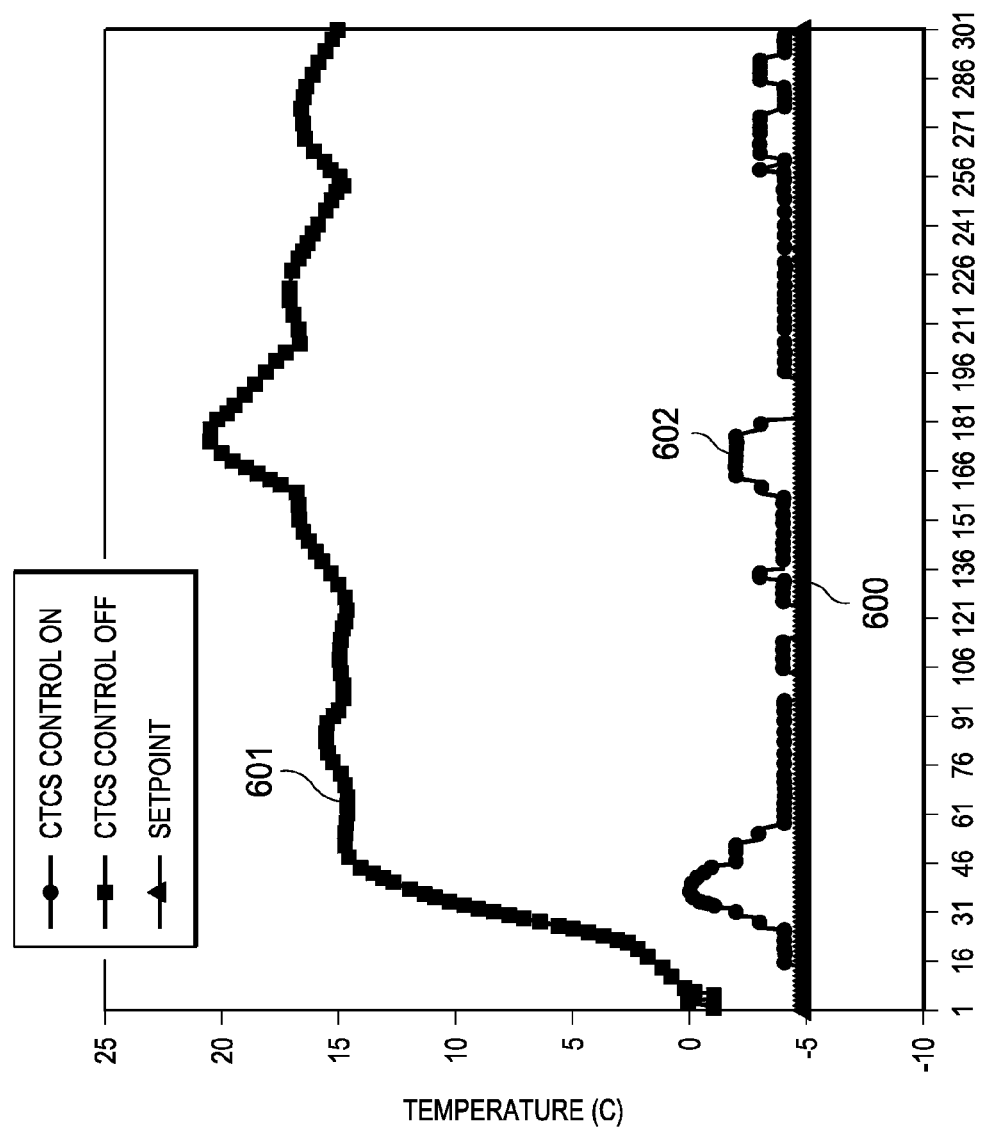
Figure 7:
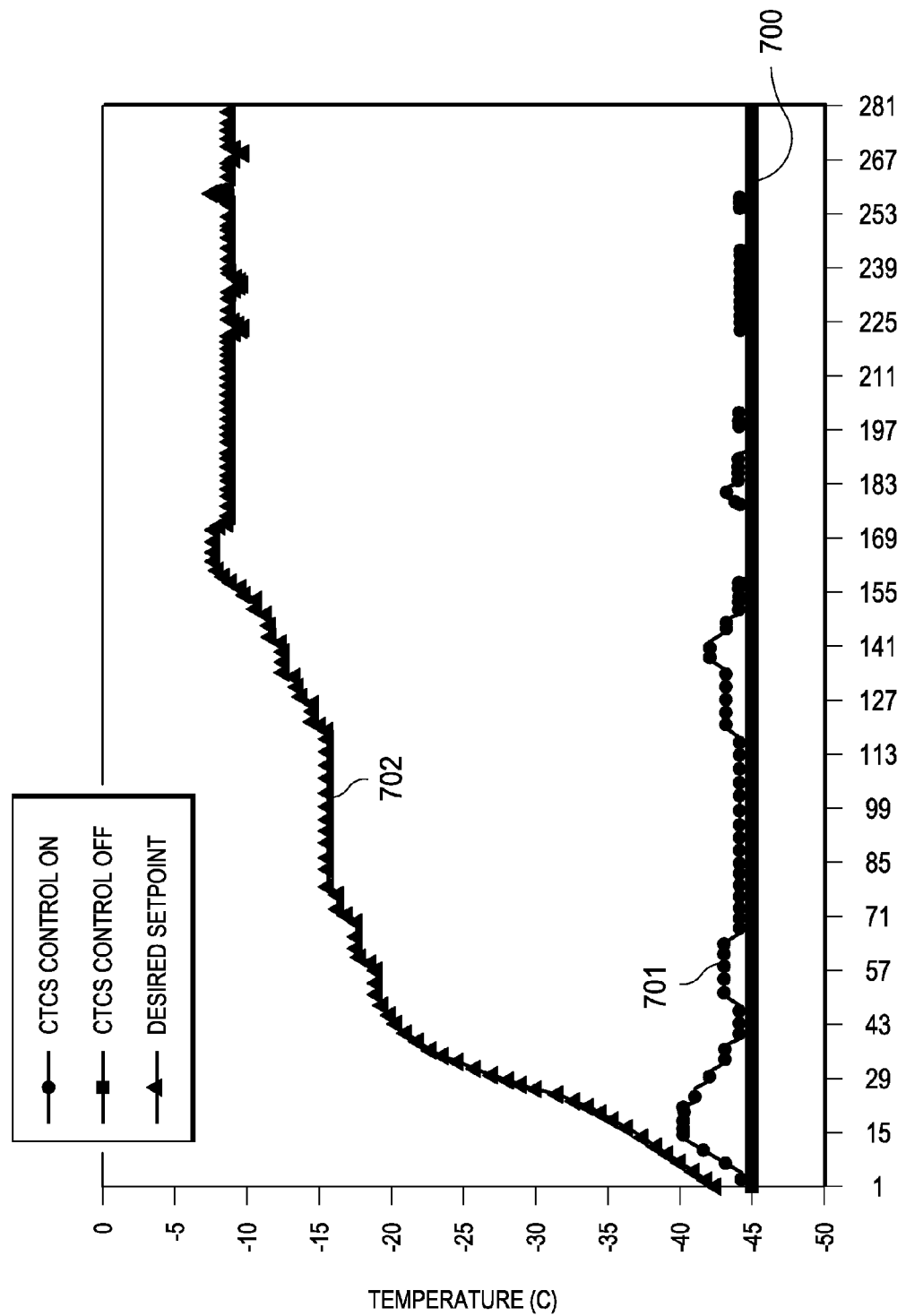

FIGS. 5, 6 and 7 compare the thermal performance of this invention with the CTCS system turned ON and OFF for several set point temperatures. FIG. 5 illustrates a set point temperature of 105 C. FIG. 5 shows a deviation of about ±2 C with CTCS ON and a maximum deviation of over 20 C with CTCS OFF. FIG. 6 illustrates a set point temperature of −5 C. FIG. 6 shows a deviation of about +5 C with CTCS ON and a maximum deviation of over 25 C with CTCS OFF. FIG. 7 illustrates a set point temperature of −45 C. FIG. 7 shows a deviation of about +4 C with CTCS ON and a maximum deviation of over 50 C with CTCS OFF.

Figure 8:
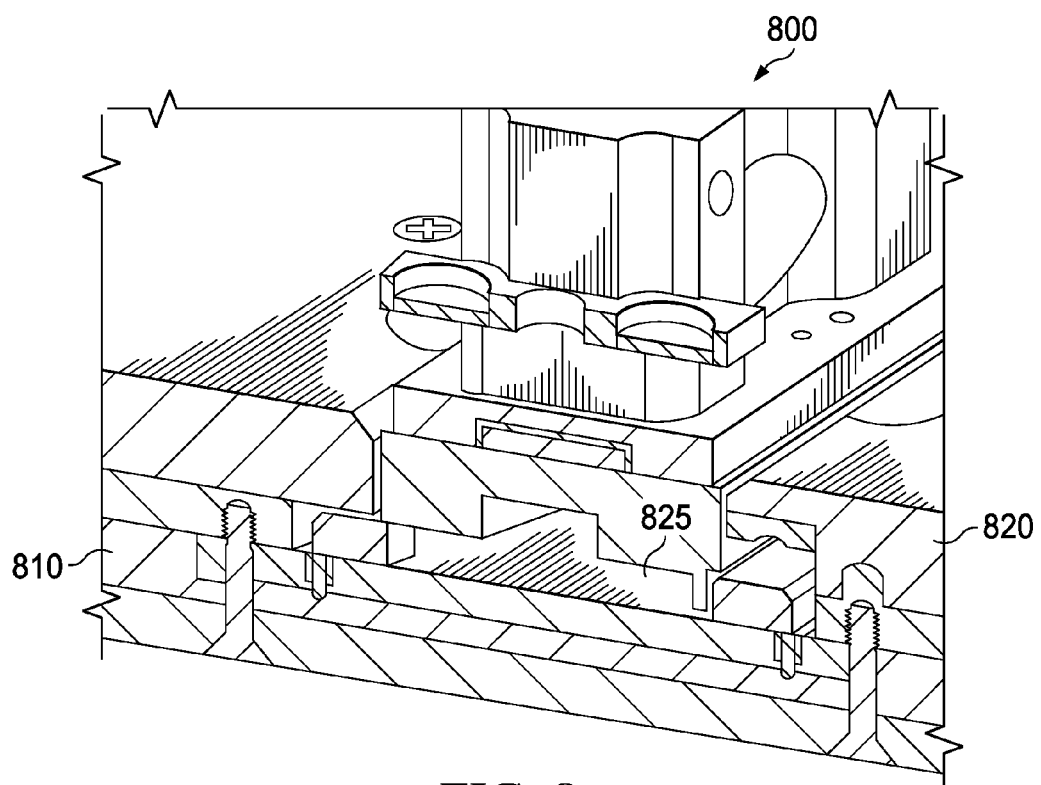
FIG. 8 illustrates a prior art handler interface.
Figure 9:
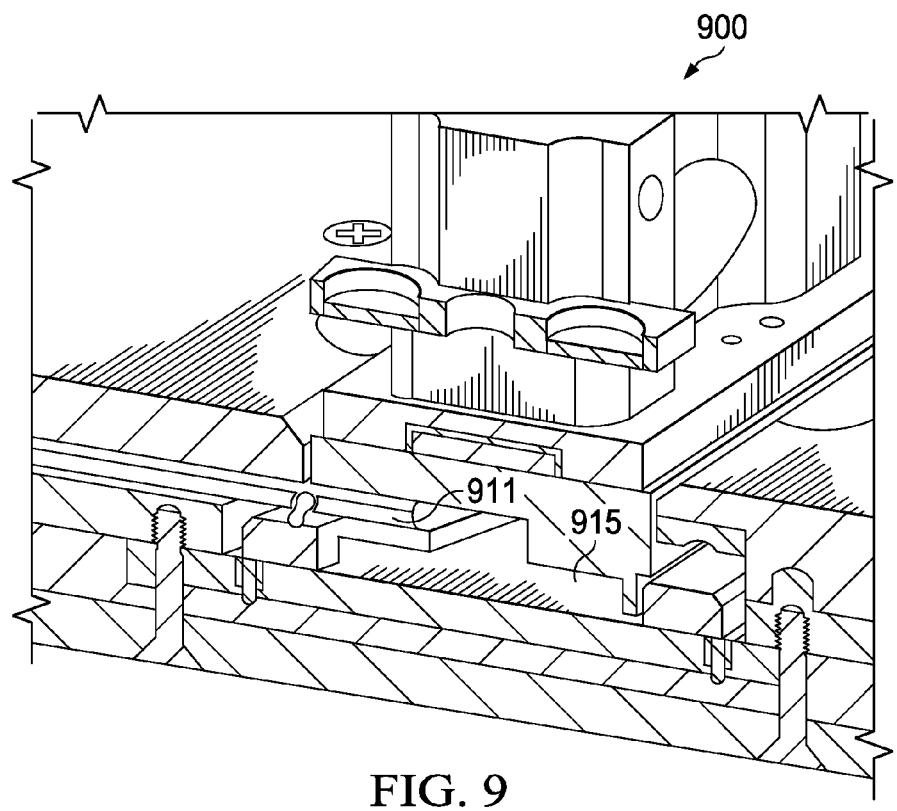
FIGS. 9 and 10 are two views of the retrofitted handler according to an embodiment of this invention.
Figure 10:
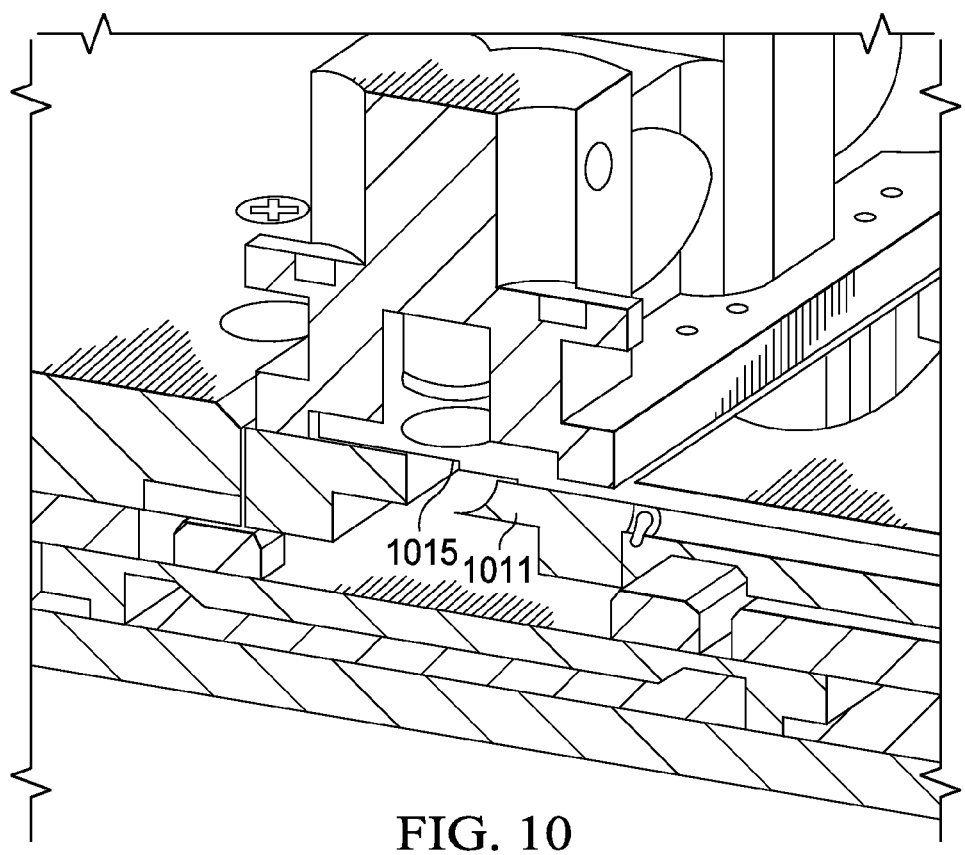

FIGS. 8 to 10 illustrate a retrofit of elements of this invention into an existing handler interface. FIG. 8 illustrates one view of a prior art handler interface 800 which does not include the cooling control of this invention. Prior art handler interface 800 includes a DUT board side 810 and a handler side 820. When closed to enclose the DUT prior art handler interface 800 includes a cavity 825 accommodating the DUT.

FIGS. 9 and 10 are two views of the retrofitted handler according to an embodiment of this invention. FIG. 9 illustrates a first cut away view of a cooling fluid inlet. DUT board side 810 is modified to include a inlet 911. FIG. 9 further illustrates a large exposed device area 915 receiving the cooling fluid over the back of the DUT. FIG. 10 is another cut away view illustrating a cooling fluid outlet. FIG. 10 shows that DUT board side 810 includes a smaller diameter exhaust area 1015 feeding an exhaust 1011.

Figure 11:
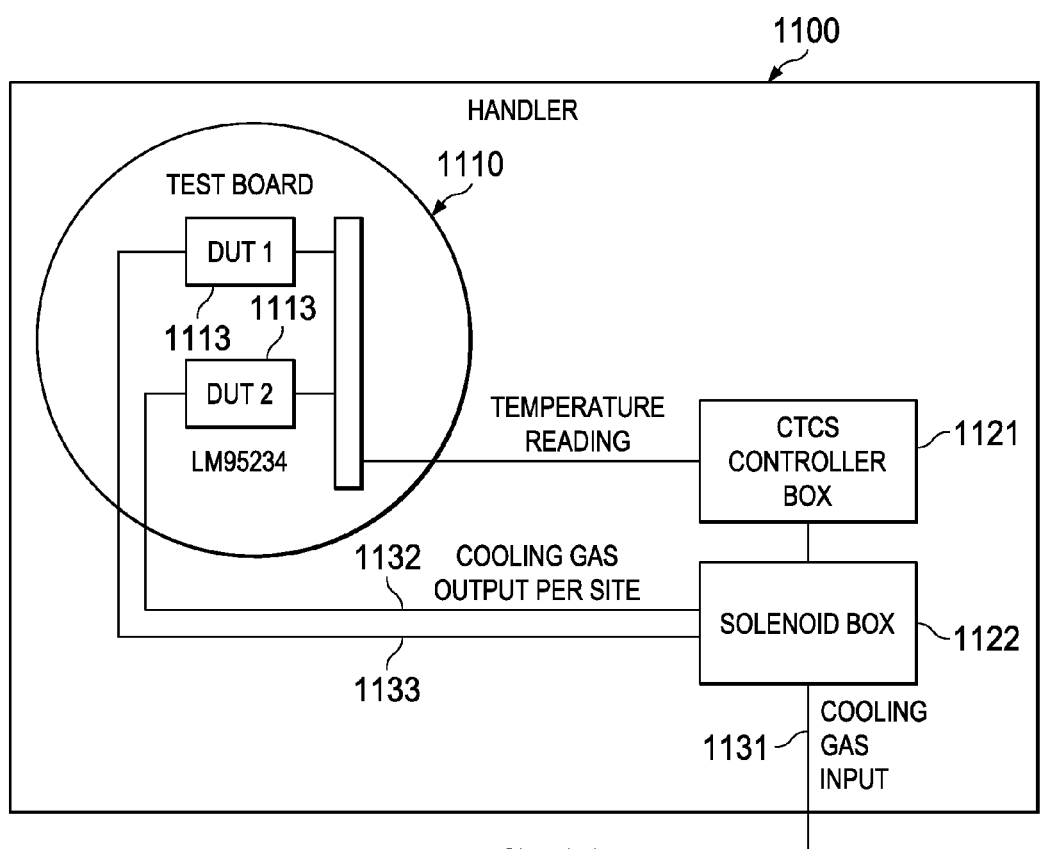
FIG. 11 illustrates an alternative embodiment of the arrangement of parts of this invention.

FIG. 11 illustrates an alternative embodiment of the arrangement of parts of this invention. Handler 1100 includes test board 1110 holding plural DUTs 1113. I$^2$C chip 1112 is connected to each DUT 1113 generating a temperature signal corresponding to a temperature sensed by thermal diodes on each DUT 1113. These temperature signals are supplied to controller box 1121. Controller box 1121 includes a microcontroller similar to microcontroller 111 and a solenoid drive box similar to solenoid drive circuitry 121 for each DUT. Controller box 1121 supplies PWM drive signals for the solenoids.

Solenoid box 1122 receives input cooling fluid on line 1131. Solenoid box 1122 individually controls cooling fluid in lines 1132 and 1133 supplied to the plural DUTs 1113. FIG. 11 does omits illustration of the exhaust system.

This invention is an external system that would control DUT thermal heating using our existing production handlers (Delta Castle series). This invention uses an externally controlled solenoid system, the DUT thermal diode and a microcontroller. This invention uses a retrofit fixture for an existing production handler.

What is claimed is:

1. An integrated circuit test handler for an integrated circuit having at least one thermal diode comprising:
   a device under test board adapted to receive said integrated circuit for test;
   an electrical connector for coupling to said at least one thermal diode on said integrated circuit;
   a microcontroller connected to said electrical connector programmed to
      subtract a temperature corresponding to signals from the at least one thermal diode on said integrated circuit from a temperature set point thereby generating an error signal, and
      compute a solenoid drive signal from said error signal;
   a source of cooling fluid;
   a valve coupled to the source of cooling fluid, said valve having an open state supplying cooling fluid to bathe said integrated circuit and a closed state excluding cooling fluid from said integrated circuit; and
   a solenoid receiving said solenoid drive signal and controlling the open/closed state of said valve.

2. The integrated circuit test handler of claim 1, wherein:
   said cooling fluid is boiled liquid nitrogen.

3. The integrated circuit test handler of claim 1, wherein:
   said cooling fluid is compressed air.

4. The integrated circuit test handler of claim 1, further comprising:
   an I$^2$C interface connected by said electrical connector to said at least one thermal diode generating a signal suitable for reading by said microcontroller.

5. The integrated circuit test handler of claim 4, further comprising:
   said I$^2$C interface is mounted on said device under test board.

6. The integrated circuit test handler of claim 5, further comprising:
   said microcontroller is mounted on a circuit board separate from said device under test board.

7. The integrated circuit test handler of claim 1, wherein:
   said microcontroller is programmed to compute a solenoid drive signal by
      forming a Proportional-Integral-Derivative function of said error signal, and
      converting said Proportional-Integral-Derivative function into a pulse width modulated drive function for said solenoid.

8. The integrated circuit test handler of claim 1, further comprising:
   a solenoid drive circuit connected to said microcontroller receiving said pulse width modulated drive function and generating an amplified solenoid drive function suitable for controlling said solenoid.

9. The integrated circuit test handler of claim 8, wherein:
   said solenoid drive circuit includes an operational amplifier.

10. The integrated circuit test handler of claim 1, wherein:
    said microcontroller is mounted on said device under test board; and
    said integrated circuit test handled further includes a handler chuck having said valve and said solenoid mounted thereon, said device under test board and said handler chuck forming a pocket above a free side of the integrated circuit for introduction of said cooling fluid by said valve.

11. The integrated circuit test handler of claim 10, wherein:
    said integrated circuit test handler comprises a device under test side holding said device under test board and a handler side, said device under test side formed by retrofitting an inlet and an exhaust for said cooling fluid.

12. An integrated circuit test handler for a plurality of integrated circuits, each device under test having at least one thermal diode comprising:
- a device under test board adapted to receive said plurality of integrated circuits for test;
- an electrical connector for coupling to said at least one thermal diode on each integrated circuit;
- a microcontroller connected to said electrical connector programmed to
  - subtract a temperature corresponding to signals from the at least one thermal diode on each integrated circuit from a temperature set point thereby generating an error signal, and
  - compute a solenoid drive signal from said error signal;
- a source of cooling fluid;
- a plurality of valves coupled to the source of cooling fluid, each valve having an open state supplying cooling fluid to bathe a corresponding integrated circuit and a closed state excluding cooling fluid from said corresponding integrated circuit; and
- a plurality of solenoids receiving corresponding solenoid drive signal and controlling the open/closed state of a corresponding one of said valves.

* * * * *